US007841085B2

(12) United States Patent
Miyata et al.

(10) Patent No.: US 7,841,085 B2
(45) Date of Patent: Nov. 30, 2010

(54) METHOD FOR MANUFACTURING LIQUID JET HEAD

(75) Inventors: Yoshinao Miyata, Nagano-ken (JP); Kenichi Kitamura, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1093 days.

(21) Appl. No.: 11/538,382

(22) Filed: Oct. 3, 2006

(65) Prior Publication Data

US 2007/0074394 A1 Apr. 5, 2007

(30) Foreign Application Priority Data

Oct. 5, 2005 (JP) ............................ 2005-292856

(51) Int. Cl.
*B21D 53/76* (2006.01)
*H01S 4/00* (2006.01)
*H01L 21/00* (2006.01)

(52) U.S. Cl. ...................................... 29/890.1; 438/462

(58) Field of Classification Search ................ 29/592.1, 29/890.1; 347/68, 71; 438/462
See application file for complete search history.

(56) References Cited

U.S. PATENT DOCUMENTS 6,594,898 B1 * 7/2003 Yun .......................... 29/890.1
7,523,553 B2 * 4/2009 Ohsumi et al. ............. 29/890.1
7,585,423 B2 * 9/2009 Nakanishi .................... 216/27

FOREIGN PATENT DOCUMENTS

JP 05-024204 2/1991
JP 05-155030 6/1993
JP 07-022605 1/1995
JP 2001-121690 5/2001
JP 2003-200578 7/2003
JP 2005-183419 7/2005
WO WO2004007206 1/2004

* cited by examiner

*Primary Examiner*—David P Bryant
*Assistant Examiner*—Alexander P Taousakis
(74) *Attorney, Agent, or Firm*—Workman Nydegger

(57) ABSTRACT

A method for manufacturing a liquid jet head is provided which includes a flow channel board having at least pressure-generating chambers communicating with nozzle holes and a pressure generator above one surface that applies pressure for jetting liquid to the pressure-generating chambers, and a silicon single-crystal reservoir board having at least a reservoir section that communicates with the pressure-generating chambers and that is defined by a through hole passing through the reservoir board and a step with a riser formed so as to open up the through hole at one surface. In the method, a mask pattern having an opening is formed on a reservoir-forming board intended for the reservoir board. The opening has a correction pattern on its wall and a dummy mask pattern is formed in the opening. The correction pattern serves to expose a predetermined crystal plane of the reservoir-firming board to define the riser of the step. The dummy mask pattern has a plurality of separate mask portions and serves to substantially match the etching rate of the reservoir-forming board in the region opposing the correction pattern with the etching rate of the reservoir-forming board in the region opposing the opening of the mask pattern. The reservoir-forming board is anisotropically etched through the mask pattern having the correction pattern and the dummy mask pattern, so that the reservoir section having the step is formed.

6 Claims, 5 Drawing Sheets

METHOD FOR MANUFACTURING LIQUID JET HEAD

The entire disclosure of Japanese Patent Application No. 2005-292856, filed Oct. 5, 2005 is expressly incorporated by reference herein.

BACKGROUND

1. Technical Field

The present invention relates to a method for manufacturing a liquid jet head that jets liquid, and particularly to a method for manufacturing an ink jet recording head that jets ink as the liquid.

2. Related Art

An ink jet recording head, which is a type of liquid jet head, may include pressure-generating chambers communicating with nozzle holes, a communicating section communicating with the pressure-generating chambers, a flow channel board with a piezoelectric element above one surface, and a reservoir board (sealing board) having a reservoir section defining part of a reservoir together with the communicating section of the flow channel board. The reservoir board may be made of a (110) plane-oriented silicon single crystal, and the reservoir section may be formed by anisotropically etching the reservoir board through a mask pattern or the like (as disclosed in, for example, WO 2004/007206).

The reservoir section (or reservoir) basically passes through the reservoir board (or flow channel board), and some types of reservoir section have a step (gap) formed by removing part of the reservoir board (as disclosed in, for example, Japanese Unexamined Patent Application Publication No. 2001-121690).

If the step is formed by the above-mentioned anisotropic etching of the reservoir board, the surface of the step undesirably becomes uneven. The uneven surface of the step traps air in its recesses. The air can disadvantageously prevent ink from jetting. The ink is liable to be trapped particularly in early stages of ink supply and becomes difficult to jet.

Such a disadvantage can be produced by manufacturing methods of not only ink jet recording heads jetting ink, but also liquid jet heads jetting other liquids.

SUMMARY

An advantage of the invention is that it provides a method for manufacturing a liquid jet head. The method can favorably form a step in the reservoir and thus prevent jetting failure.

According to an aspect of the invention, a method for manufacturing a liquid jet head is provided. The liquid jet head includes a flow channel board having at least pressure-generating chambers communicating with nozzle holes and a pressure generator above one surface that applies pressure for jetting liquid to the pressure-generating chambers, and a silicon single-crystal reservoir board having at least a reservoir section that communicates with the pressure-generating chambers and that is defined by a through hole passing through the reservoir board and a step with a riser formed so as to open up the through hole at one surface. The method includes forming a mask pattern having an opening on a reservoir-forming board intended for the reservoir board. The opening has a correction pattern on its wall and a dummy mask pattern in it. The correction pattern serves to expose a predetermined crystal plane of the reservoir-forming board to define the riser of the step. The dummy mask pattern has a plurality of separate mask portions and serves to substantially match the etching rate of the reservoir-forming board in the region opposing the correction pattern with the etching rate of the reservoir-forming board in the region opposing the opening of the mask pattern. The reservoir-forming board is anisotropically etched through the mask pattern having the correction pattern and the dummy mask pattern. Thus, the reservoir section having the step is formed.

This method can form a step with a substantially even surface. Consequently, the resulting liquid jet head can prevent air from being trapped when liquid is supplied into the reservoir section and thus prevent jetting failure due to trapped air.

The mask portions of the dummy mask pattern may be arranged so as to increase the etching rate of the reservoir-forming board.

Thus, the etching rate of the riser of the step can certainly match with the etching rate of the other region of the step.

The mask portions of the dummy mask pattern may be arranged such that the ends in the longitudinal direction of each mask portion are staggered with respect to the ends in the longitudinal direction of the adjacent mask portions.

Consequently, the reservoir-forming board in the region opposing the dummy mask pattern can be uniformly removed.

The reservoir-forming board may be made of a (110) plane-oriented silicon single crystal and the reservoir section may have walls defined by a first (111) plane perpendicular to the (110) plane and a second (111) plane forming an angle of 70.53° with the first (111) plane. The mask portions of the dummy mask pattern are formed parallel to the first (111) plane.

Thus, a reservoir section having a step with an even surface can be precisely formed in the (110) plane-oriented silicon single-crystal reservoir-forming board.

The correction pattern may have a plurality of protrusions protruding parallel to the second (111) plane toward the inside of the opening, and the mask portions of the dummy mask pattern have a length less than twice the length of the protrusions.

The correction pattern and the dummy mask pattern are gradually etched when the silicon single-crystal reservoir-forming board is etched. Thus, the reservoir section can be formed into a desired shape.

The mask pattern including the dummy mask pattern may be formed of silicon oxide or silicon nitride.

Such a mask pattern is etched more slowly than the silicon single-crystal reservoir-forming board, but with reliability. Thus, the reservoir section can be formed into a desired shape.

BRIEF DESCRIPTION OF THE DRAWINGS

The invention will be described with reference to the accompanying drawings, wherein like numbers reference like elements.

DESCRIPTION OF EXEMPLARY EMBODIMENTS

The invention will be further described with reference to exemplary embodiments.

Embodiment

Figure 1:
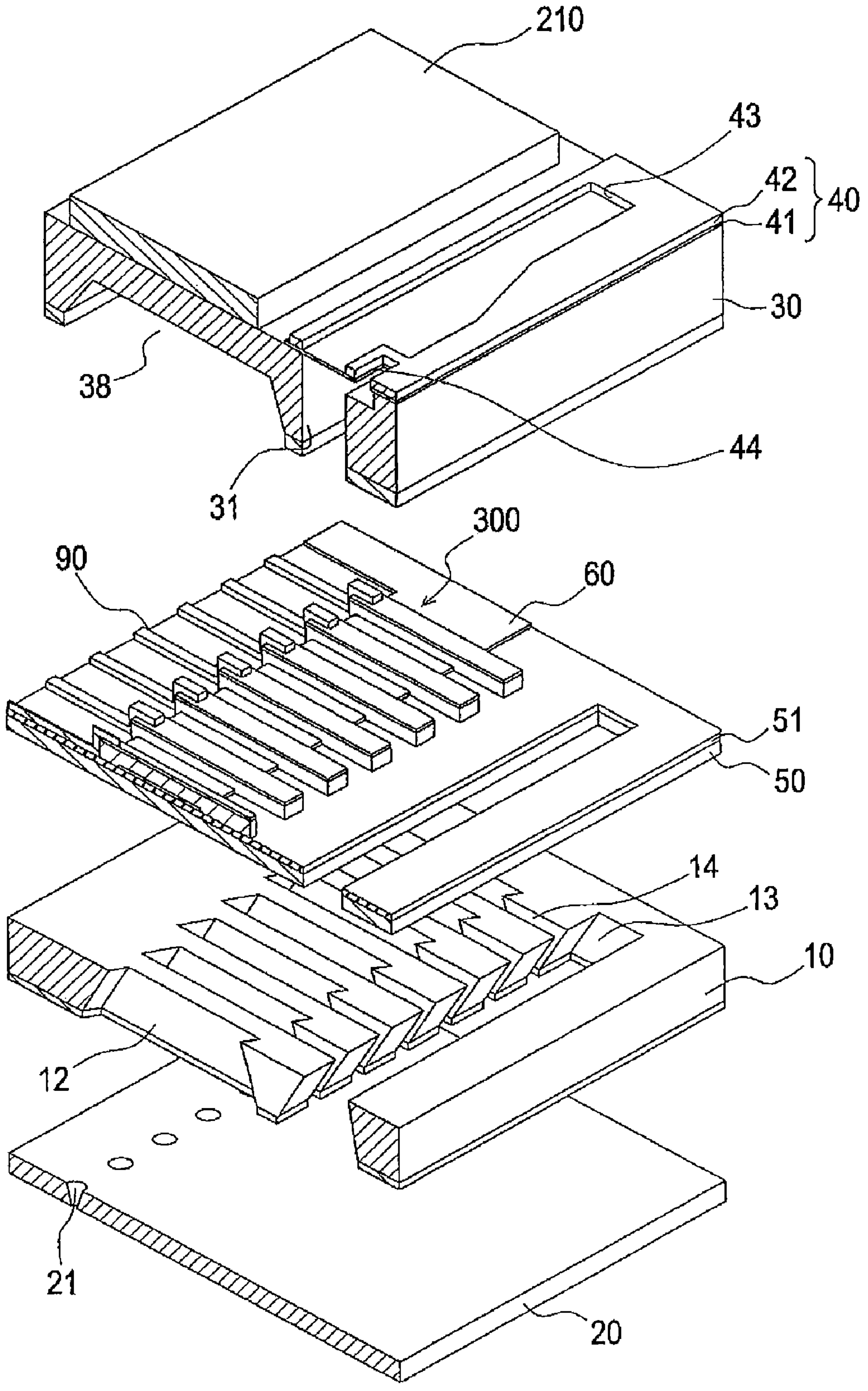
FIG. 1 is an exploded perspective view, of a recording head according to an embodiment of the invention.
Figure 2A:
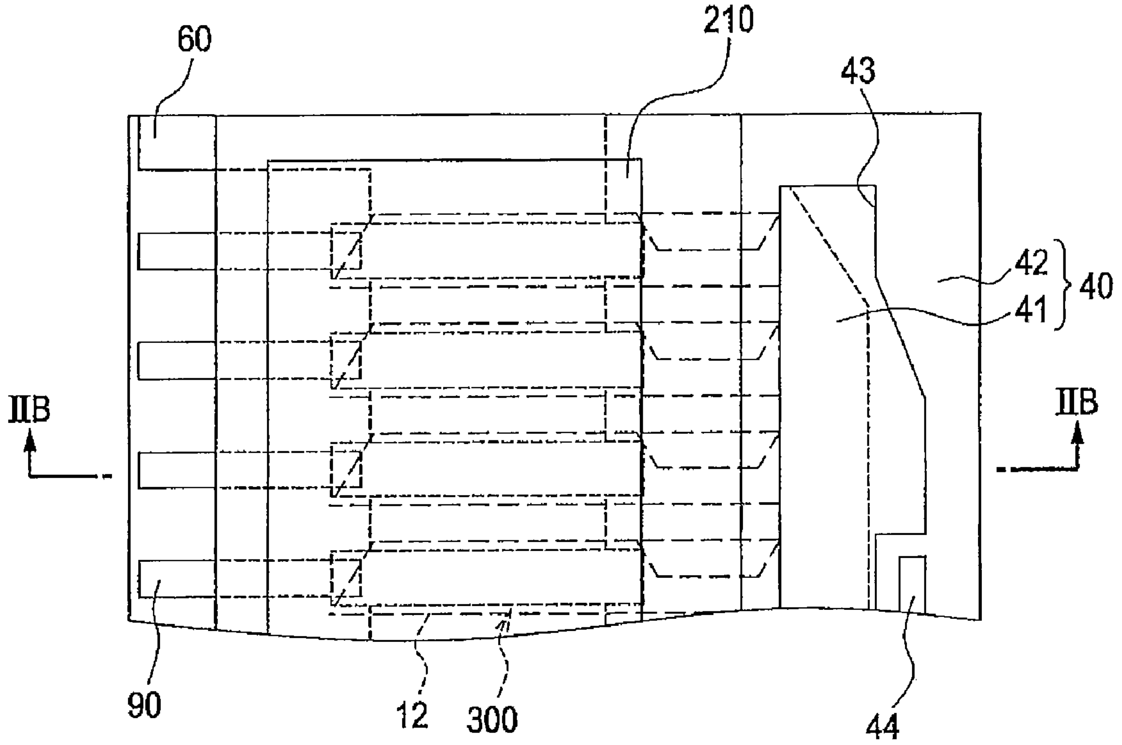
FIGS. 2A and 2B are a plan view and a sectional view of the recording head according to the embodiment respectively.
Figure 2B:
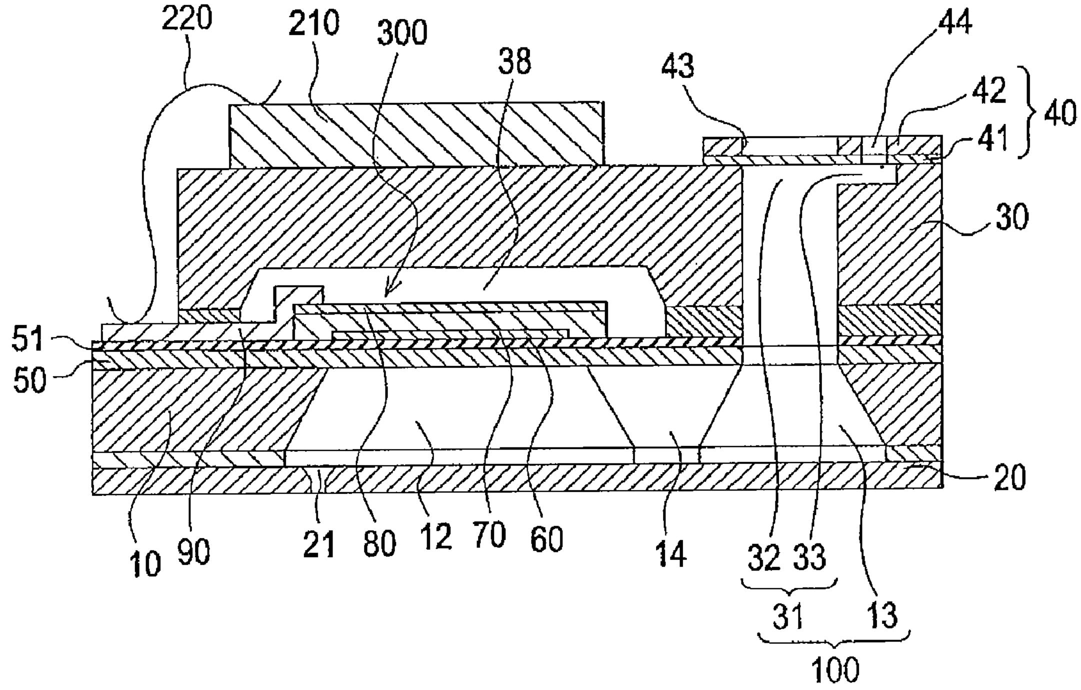
Figure 3:
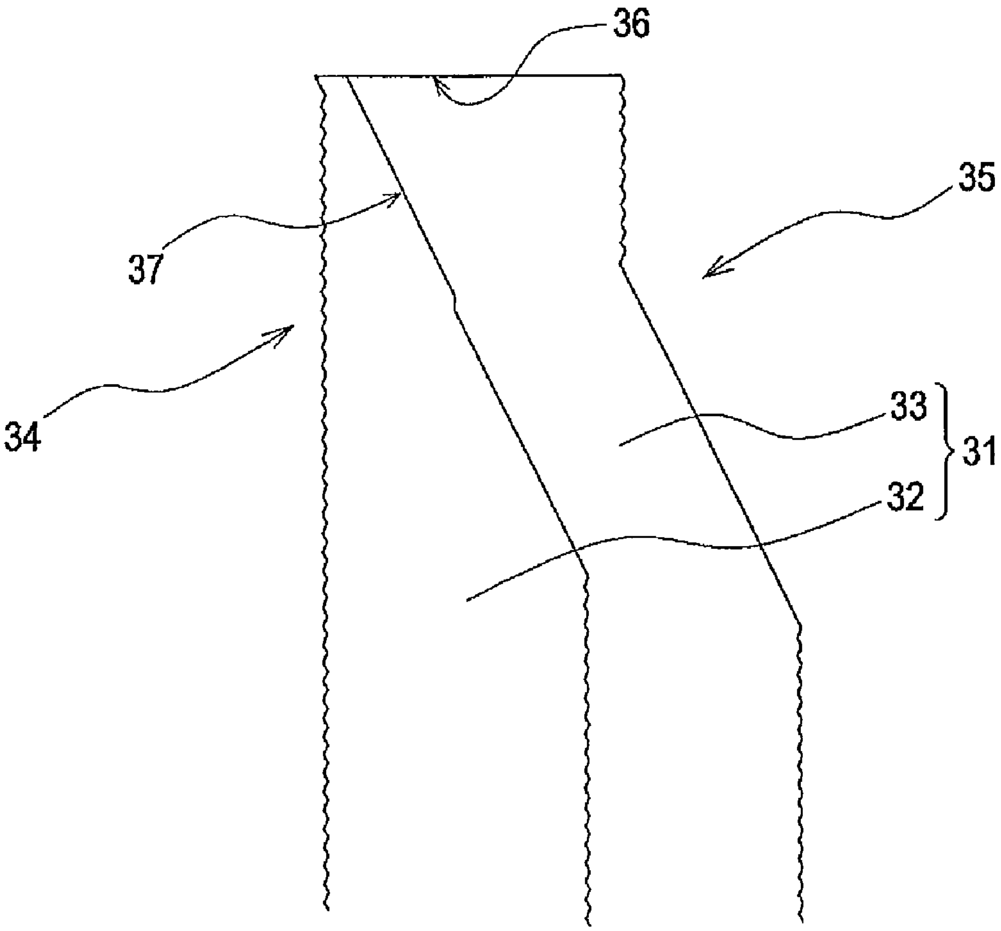
FIG. 3 is a fragmentary enlarged view of a reservoir section of the recording head according to the embodiment.

FIG. 1 is an exploded perspective view of an ink jet recording head manufactured by a method according to an embodiment of the invention. FIGS. 2A and 2B are plan view and a sectional view of the ink jet recording head shown in FIG. 1. FIG. 3 is a fragmentary enlarged view of a part shown in FIGS. 2A and 2B. In these figures, a flow channel board 10 is formed of a (110) plane-oriented silicon single crystal. The flow channel board 10 has a silicon dioxide elastic film 50 that has been formed to a thickness of 0.5 to 2 μm on one surface in advance by thermal oxidation.

The flow channel board 10 has a plurality of pressure-generating chambers 12 arranged in parallel in their width direction. In addition, a communicating section 13 is formed in the flow channel board 10 on the outer side in the longitudinal direction of the pressure-generating chambers 12. The communicating section 13 communicates with the pressure-generating chambers 12 through ink supply channels 14 provided for each pressure-generating chamber 12. The communicating section 13 communicates with a below-described reservoir section 31 of the reservoir board 30 to define part of a reservoir 100 serving as a common ink chamber of the pressure-generating chambers 12. The ink supply channel 14 has a smaller width than the pressure-generating chamber 12, so that the resistance of the flow channel is kept constant to the ink flowing from the communicating section 13 to the pressure-generating chamber 12.

The open side of the flow channel board 10 is bonded with a nozzle plate 20 with an adhesive or a heat welding film. The nozzle plate 20 has nozzle holes 21 communicating with the respective ends of the pressure-generating chambers 12 opposite the ink supply channels 14. The nozzle plate 20 can be made of, for example, glass ceramic, silicon single crystal, or stainless steel with a thickness of about 0.01 to 1 mm and a linear expansion coefficient of 2.5 to 4.5 ($\times10^{-6}$/° C.) at 300° C. or less.

The surface of the flow channel board 10 opposite the nozzle plate 20 is covered with the above-mentioned elastic film 50 with a thickness of, for example, about 1.0 μm, and an insulting film 51 is formed to a thickness of about 0.4 μm on the elastic film 50. Furthermore, a lower electrode film 60 with a thickness of, for example, about 0.2 μm, a piezoelectric layer 70 with a thickness of, for example, about 1.0 μm, and an upper electrode film 80 with a thickness of, for example, about 0.05 μm are formed by a below-described process on the insulating film 51 to define piezoelectric elements 300. Hence, each piezoelectric element 300 includes the lower electrode film 60, the piezoelectric layer 70, and the upper electrode film 80. In general, one of the electrode films of the piezoelectric element 300 is used for a common electrode, and the other electrode film and the piezoelectric layer 70 are patterned corresponding to each pressure-generating chamber 12. In the present embodiment, the lower electrode film 60 is used for the common electrode of the piezoelectric elements 300, and the upper electrode film 80 is patterned into respective electrodes of the piezoelectric elements 300. The forms and functions of these electrode films may be reversed according to structural convenience of, for example, the actuation circuit or wiring.

Each part of the upper electrode film 80 of the piezoelectric elements 300 is connected to a corresponding leading electrode 90 made of a metal, such as gold (Au), so that voltage can be selectively applied to the piezoelectric elements 300 through the leading electrodes 90.

Furthermore, a reservoir board 30 having at least a reservoir section 31 is bonded to the surface having the piezoelectric element 300 of the flow channel board 10 with an adhesive layer made of an adhesive or the like, in between. The reservoir section 31 defines at least part of a reservoir 100 from which ink is supplied to the pressure-generating chambers 12. In the present embodiment, the reservoir section 31 is defined by a through hole 32 passing through the reservoir board 30 and a step 33 formed so as to open up the through hole 32 in the reservoir board 30 on the side opposite the flow channel board 10. The reservoir section 31 extends along the direction in which the pressure-generating chambers 12 are arranged in parallel, and the through hole 32 has tapers 34 at both ends in the longitudinal direction. The tapers 34 gradually reduce the width of the through hole 32 outward. Thus the through hole 32 is formed substantially in a trapezoidal shape. Also, the step 33 has narrower portions 35 with a smaller width than the middle portion at both ends in the longitudinal direction. The reservoir section 31 communicates with the communicating section 13 formed in the flow channel board 10, and thus the reservoir section 31 and the communicating section 13 define the reservoir 100. The tapers 34 and the narrower portions 35 are intended to control the flow rate to a predetermined level or more in the reservoir 100 at the vicinities of the pressure-generating chambers 12 and thus to enhance the discharge of air bubbles.

The reservoir board 30 having the reservoir section 31 is made of a (110) plane-oriented silicon single crystal, which is the same material as that of the flow channel board 10. The through hole 32 and the step 33 of the reservoir section 31 are formed by anisotropically etching the reservoir board 30 from both surfaces, and the detail will be described below. Consequently, the walls 36 of the reservoir section 31 (the through hole 32 and the step 33) parallel to the longitudinal direction of the pressure-generating chambers, as shown in FIG. 3, are defined by a first (111) plane perpendicular to the (110) plane, and the other walls are defined by planes including a second (111) plane 37 that forms an angle of 70.53° with the first (111) plane (the walls 36).

The reservoir board 30 is also provided with a piezoelectric element enclosure 38 in the region opposing the piezoelectric elements 300. The piezoelectric elements 300 are disposed in the piezoelectric element enclosure 38 and protected from external environment. The piezoelectric element enclosure 38 may be sealed or not. In addition, a driving IC 210 for driving the piezoelectric elements 300 is mounted on the reservoir board 30. The ends of the leading electrodes 90 extracted from the piezoelectric elements 300 to the outside of the piezoelectric element enclosure 38 are electrically connected to the driving IC 210 with driving wires 220.

The reservoir section 31 of the reservoir board 30 is covered with a compliance board 40 including a sealing film 41 and a fixing plate 42. The compliance board 40 is bonded to the upper surface of the reservoir board 30. The sealing film 41 is made of a less rigid, flexible material (for example, a polyphenylene sulfide (PPS) film has a thickness of 6 μm) and seals one side of the reservoir section 31. The fixing plate 42 is made of a hard material, such as a metal (for example, a stainless steel (SUS) has a thickness of 30 μm). The thickness of the fixing plate 42 in the region opposing the reservoir 100 is completely removed to form an opening 43. Thus, the one side of the reservoir 100 is sealed only by the flexible sealing film 41. The compliance board 40 is further provided with an ink inlet 44 in the region opposing the step. Ink is introduced into the reservoir from an ink cartridge through the ink inlet 44. The ink inlet 44 provided in the region opposing the step 33 helps the ink flow smoothly to prevent air from being trapped, thus enhancing ink jetting performance.

In the ink jet recording head of the present embodiment, ink is delivered from external ink supply means (not shown) to fill the spaces from the reservoir 100, to the nozzle holes 21. Then, a voltage is applied between the lower electrode film 60 and the upper electrode film 80 patterned corresponding to the pressure-generating chambers 12, according to recording signals from the driving IC 210. Thus, the piezoelectric element 300 and the elastic film 50 are warped to increase the pressures in the pressure-generating chambers 12, and the ink is jetted through the nozzle holes 21.

Figure 4A:
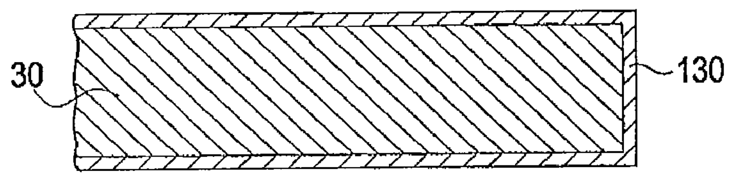
FIGS. 4A to 4 E are sectional views showing process steps for preparing a reservoir board according to the embodiment.

A method for manufacturing such an ink jet recording head, particularly a method for forming the reservoir board 30 of the ink jet recording head, will now be described with reference to FIGS. 4A to 4E and 5. First, the reservoir board 30, or a (110) plane-oriented silicon single-crystal substrate, is thermally oxidized in a diffusion furnace of about 1,100° C. to form a silicon dioxide layer 130 over the entire surface of the board, as shown in FIG. 4A. The thickness of the reservoir board 30 is not particularly limited, but the present embodiment uses a silicon single-crystal substrate (silicon wafer) with a thickness of about 400 μm as the reservoir board 30.

Figure 4B:
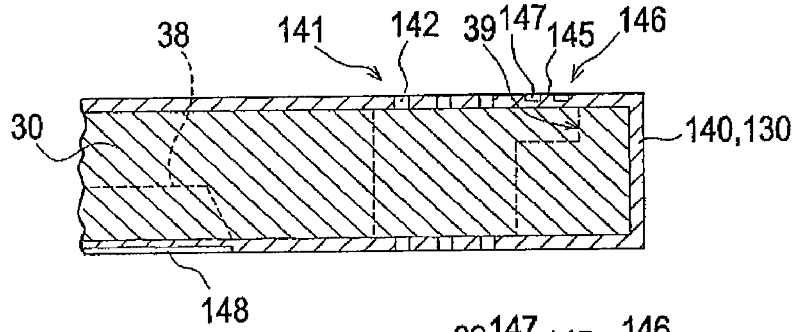
Figure 5:
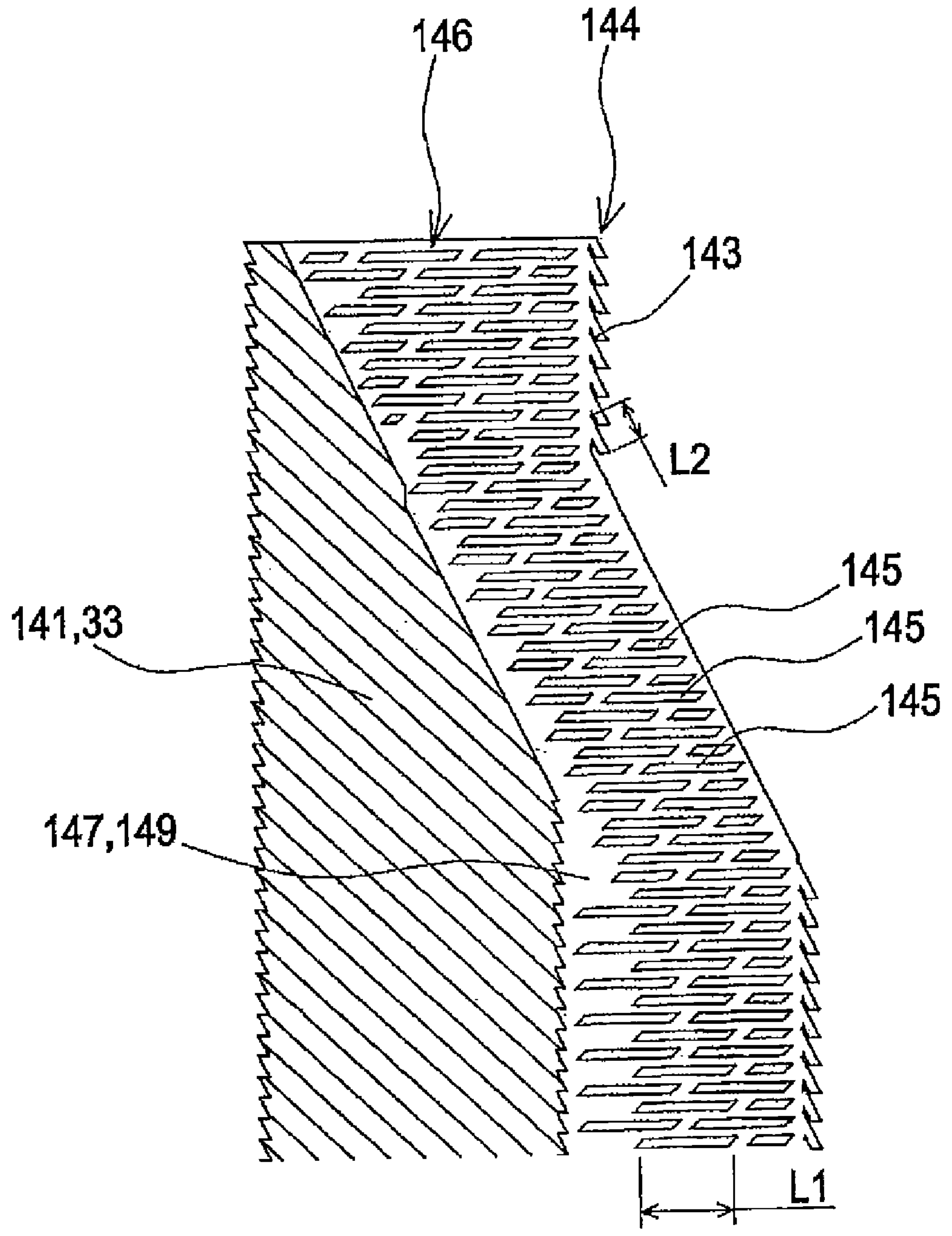
FIG. 5 is a schematic representation showing a mask pattern and a dummy mask pattern.

Turning to FIG. 4B, the silicon dioxide layer 130 is etched through a resist layer or the like (not shown) to form a mask pattern 140 serving as a mask for forming the reservoir section 31 by etching. Specifically, a correction mask 141 is formed which has a plurality of holes 142 in the silicon dioxide layer 130 in the region where the through hole 32 of the reservoir section 31 is to be formed. As shown in FIG. 5, the correction mask 141 is formed in the regions opposing the through hole 32 (hatched region), and many holes 142, not shown in FIG. 5, are closely formed in these regions opposing the through hole 32. In addition, the mask pattern includes a correction pattern 144 and a dummy mask pattern 146. The correction pattern 144 is formed in the mask pattern 140 (silicon dioxide layer 130) in the region opposing the edge of the step 33. The correction pattern 144 has a plurality of protrusions 143 protruding into the region opposing the step 33 and serves to expose a predetermined crystal plane defining the riser 39 of the step 33, that is, the second (111) plane in the present embodiment. The dummy mask pattern 146 is formed on the inner side from the correction pattern 144. The dummy mask pattern 146 has a plurality of mask portions 145 with a larger thickness than the other portions of the dummy mask pattern.

Figure 4C:
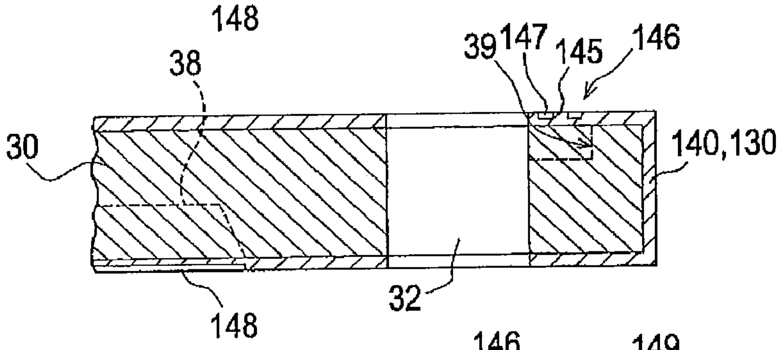

The regions of the mask pattern 140 (silicon dioxide layer 130) other than the protrusions 143 and the mask portions 145, in the region opposing the step 33, have been partially removed by half etching and formed into recesses 147 (FIG. 4B) in this stage of the process. In other words, the region of the reservoir board 30 intended for the step 33 is completely covered with the silicon dioxide layer 130 in this stage. In addition, a recess 148 is also formed in the mask pattern 140 (silicon dioxide layer 130) in the region opposing the piezoelectric element enclosure 38 by half-etching the silicon dioxide layer 130. Then, the reservoir board 30 is etched from both surfaces through such a mask pattern 140 to form the through hole 32 as shown in FIG. 4C.

Figure 4D:
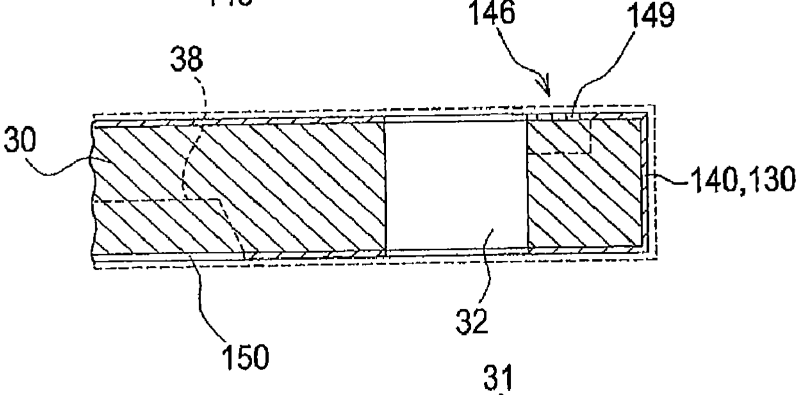

Turning now to FIG. 4D, the mask pattern 140 (silicon dioxide layer 130) is etched to reduce the entire thickness of the silicon dioxide layer 130. Specifically, the entire silicon dioxide layer 130 is etched until openings are formed in the regions of the silicon dioxide layer 130 corresponding to the recesses 147 and 148. Thus, an opening 149 having the correction pattern 144 defined by the protrusions 143 at the periphery is formed in the silicon dioxide layer 130 in the region opposing the step 33, and the dummy mask pattern 146 defined by the separate mask portions 145 is formed in the opening 149. Also, an opening 150 is formed in the mask pattern 140 on the flow channel board side of the reservoir board 30 corresponding to the region where the piezoelectric element enclosure 38 is to be formed.

The correction pattern 144 substantially reduces the etching time of the reservoir board 30 in the region opposing the correction pattern 144, that is, substantially increases the etching rate of the reservoir board 30. The etching rate is particularly increased when the etchant, such as KOH, has a relatively low concentration of, for example, about 20%. In the present embodiment, the dummy mask pattern 146 is formed in the opening 149 so that the etching rate of the reservoir board 30 in the region opposing the correction pattern 144 becomes substantially the same as the etching rate of the reservoir board 30 in the opening 149.

The correction pattern 144 of the present embodiment is used for exposing the second (111) plane defining the riser 39 of the step 33, and its protrusions 143 are formed so as to protrude parallel to the second (111) plane toward the inside of the opening 149. The mask portions 145 of the dummy mask pattern 146 are preferably arranged so as to increase the etching rate of the reservoir board 30. Specifically, the mask portions 145 of the dummy mask pattern 146 are arranged such that the ends in the longitudinal direction of the mask portions 145 are staggered. In the present embodiment, for example, the mask portions 145 are formed parallel to the first (111) plane such that the ends in the longitudinal direction of the mask portions are staggered with respect to the ends in the longitudinal direction of the adjacent mask portions 145.

Consequently, the etching time of the reservoir board 30 in the region opposing the opening 149 can be certainly reduced. In other wards, the etching rate of the reservoir board 30 in the region opposing the opening 149 can substantially be increased. The length L1 of such mask portions 145 is not particularly limited, but is preferably set to less than twice the length L2 of the protrusions 143 of the correction pattern 144. Thus, the etching rate of the reservoir board 30 in the region opposing the opening 149 can be certainly matched with the etching rate of the reservoir board 30 in the region opposing the correction pattern 144.

In the present embodiment, the mask portions 145 of the dummy mask pattern 146 are formed parallel to the first (111) plane. However, the mask portions 145 may be formed parallel to the second (111) plane. This arrangement can match the etching rate of the reservoir board 30 in the region opposing the opening 149 with the etching rate of the reservoir board 30 in the region opposing the correction pattern 144 as well.

Figure 4E:
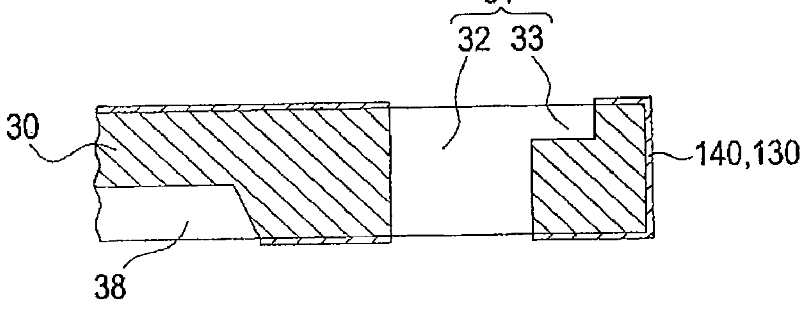

Turning now to FIG. 4E, the reservoir board 30 is then further anisotropically etched from both surfaces through the mask pattern 140 including the dummy mask pattern 146 to complete the reservoir section 31 defined by the through hole 32 and the step 33 and the piezoelectric element enclosure 38 in the reservoir board 30. The correction pattern 144 and the dummy mask pattern 146 are removed by etching for forming the step 33.

By forming the reservoir section 31 in the above-described manner, the step 33 can be formed in an extremely good state. Specifically, the surface of the step 33 can be extremely even without projections or depressions. Consequently, ink can flow smoothly in the reservoir section 31 with, for example, no air trapped. Thus, jetting failure can be prevented and the quality in printing can be greatly enhanced.

In practice, the reservoir board 30 having the reservoir section 31 or the like is formed on a silicon wafer integrally with a plurality of the same reservoir boards. Specifically, after a plurality of sets of the reservoir section 31 and other parts are formed in and on a silicon wafer in the above-described process, the silicon wafer is cut into reservoir boards 30.

Modifications

While the invention has been described with reference to the exemplary embodiment, it is to be understood that the invention is not limited to the disclosed exemplary embodiment. For example, although the mask portions of the dummy mask pattern are arranged so as to increase the etching rate of the reservoir board in the above embodiment, the arrangement of the mask portions is not particularly limited. The mask portions can be arranged in any manner as long as the etching rate of the reservoir board in the region opposing the correction pattern matches with the etching rate of the reservoir board in the region opposing the opening.

While the embodiment uses the thin-film piezoelectric element to generate pressure for jetting ink, any means, for example, a heater element, can be used to generate pressure.

While the embodiment has been described using an ink jet recording head as the liquid jet head, the invention is intended for liquid jet heads in general and may be applied to methods for manufacturing liquid jet heads jetting liquid other than ink. Such liquid jet heads include, for example, recording heads used in image recording apparatuses, such as printers, color material-jetting head used for manufacture of color filters of liquid crystal display devices, electrode material-jetting head used for forming electrodes of organic EL display devices, FED (field emission display) devices, and so forth, and biological organic material-jetting head used for manufacturing biochips.

What is claimed is:

1. A method for manufacturing a liquid jet head including a flow channel board having at least pressure-generating chambers therein communicating with nozzle holes and a pressure generator above one surface thereof that applies pressure for jetting liquid to the pressure-generating chambers, and a silicon single-crystal reservoir board having at least a reservoir section that communicates with the pressure-generating chambers and that is defined by a through hole passing through and a step with a riser formed so as to open up the through hole at one surface thereof, the method comprising:

forming a mask pattern having an opening on a reservoir-forming board intended for the reservoir board, the opening having a correction pattern on a wall thereof and a dummy mask pattern therein, the correction pattern serving to expose a predetermined crystal plane of the reservoir-forming board to define the riser of the step, the dummy mask pattern having a plurality of separate mask portions and serving to substantially match the etching rate of the reservoir-forming board in the region opposing the correction pattern with the etching rate of the reservoir-forming board in the region opposing the opening of the mask pattern; and anisotropically etching the reservoir-forming board through the mask pattern having the correction pattern and the dummy mask pattern, thereby forming the reservoir section having the step.

2. The method according to claim 1, wherein the mask portions of the dummy mask pattern are arranged so as to increase the etching rate of the reservoir-forming board.

3. The method according to claim 2, wherein the mask portions of the dummy mask pattern are arranged such that the ends in the longitudinal direction of each mask portion are staggered with respect to the ends in the longitudinal direction of the adjacent mask portions.

4. The method according to claim 1, wherein the reservoir-forming board is made of a (110) plane-oriented silicon single crystal and the reservoir section has walls defined by a first (111) plane perpendicular to the (110) plane and a second (111) plane forming an angle of 70.53° with the first (111) plane, and wherein the mask portions of the dummy mask pattern are formed parallel to the first (111) plane.

5. The method according to claim 4, wherein the correction pattern has a plurality of protrusions protruding parallel to the second (111) plane toward the inside of the opening, and the mask portions of the dummy mask pattern have a length less than twice the length of the protrusions.

6. The method according to claim 1, wherein the mask pattern having the correction pattern and the dummy mask pattern is formed of silicon oxide or silicon nitride.

* * * * *